United States Patent [19]

Tigelaar et al.

[11] Patent Number: 4,839,705

[45] Date of Patent: Jun. 13, 1989

[54] X-CELL EEPROM ARRAY

[75] Inventors: Howard L. Tigelaar, Allen; Allan T. Mitchell, Garland; Bert R. Riemenschneider, Murphy; James L. Paterson, Richardson, all of Tex.

[73] Assignee: Texas Instruments Incorporated, Dallas, Tex.

[21] Appl. No.: 133,709

[22] Filed: Dec. 16, 1987

[51] Int. Cl.4 .................. H01L 27/04; H01L 29/78; G11C 11/40
[52] U.S. Cl. .................. 357/23.5; 357/41; 357/45; 365/185
[58] Field of Search .............. 357/23.5, 41, 45; 365/185

[56] References Cited

U.S. PATENT DOCUMENTS

| 4,209,849 | 6/1980 | Schrenk | 357/23.5 |
| 4,281,397 | 7/1981 | Neal et al. | 365/189 |
| 4,288,863 | 9/1981 | Adam | 357/23.5 |
| 4,603,341 | 7/1986 | Bertin et al. | 357/23.7 |

Primary Examiner—William D. Larkins
Attorney, Agent, or Firm—Rodney M. Anderson; Leo N. Heiting; Melvin Sharp

[57] ABSTRACT

An X-cell EEPROM array includes a plurality of common source regions (50) that each border on four gate regions (46), both formed at a face of a semiconductor substrate (10). Each gate region (46) further adjoins a common drain region (52). Each drain region (52) is a common drain for two EEPROM select and memory transistors. A common erase region (54) is implanted into the semiconductor layer (10) in a position remote from the source regions (50) and the drain regions (52). Four floating gate electrodes (40) extend over tunnel windows (22) that are formed on the semiconductor layer (10) in positions adjacent a single erase region (54). An integral contact (64) is made through multi-level oxide (56, 58) from a metal erase line (70) to each erase region (54).

18 Claims, 3 Drawing Sheets

X-CELL EEPROM ARRAY

TECHNICAL FIELD OF THE INVENTION

This application relates in general to electrically-erasable, programmable read-only memories (EEPROMs) and more particularly concerns an X-cell EEPROM array and a method of fabricating same.

BACKGROUND OF THE INVENTION

Flash EEPROM cells ahve recently been developed to allow the erasure of the charge on the floating gates of several EEPROM memory cells at once. A description of such a cell may be found in F. Masuoka, et al., "A New Flash E$^2$PROM Cell Using Triple Polysilicon Technology," IEDM 84, page 464. Flash E$^2$PROM cells are advantageous over prior structures in that the time for a memory erase is considerably reduced.

Texas Instruments Inc. has recently developed an X-cell technology for EPROM cells. X-cell arrays of this type typically comprise a plurality of memory cells formed at a face of a semiconductor layer in rows and columns. Common sources are provided for each of four memory select transistors that are arranged around each common source in an "X" pattern. A single contact is made to each common source region.

The X-cell configuration reduces the required array area needed by conventional structures by up to 20%. These structures typically consist of common source and drain regions that are each shared by only two select transistors.

Up to this point, an X-cell layout for an electrically-erasable, programmable read-only memory (EEPROM) array has not been developed. A need has therefore arisen in the industry for a EEPROM array that combines the advantages of flash erasing with the compactness of an X-cell array.

SUMMARY OF THE INVENTION

One aspect of the invention comprises an array of electrically-erasable, programmable read-only memory cells formed at a face of a semiconductor layer that is of a first conductivity type. The array comprises a plurality of memory cells, each cell having a drain region and a source region of a second conductivity type. A gate region of the first conductivity type spaces each drain region from a respective source region.

A floating gate electrode is insulatively disposed over a portion of a respective gate region. A control electrode is insulatively disposed over at least that portion of the floating gate electrode that is over the gate region. An erase region of the second conductivity type is formed in the semiconductor layer remote from the source regions and the drain regions. Each floating gate electrode has an extension extending away from its respective gate region. A plurality of these extensions extend to points adjacent the erase region, such that the extensions are electrically coupled thereto. A preferred technique of electrically coupling the extensions of the floating gate electrodes to the erase region consists of a window formed of a thin dielectric layer on an area of the semiconductor face adjacent the erase region.

According to another aspect of the invention, an array of electrically-erasable, programmable read-only memory (EEPROM) cells is formed at a face of a semiconductor layer, as above. Each cell has a drain region of a second conductivity type opposite the first conductivity type, and is formed in the semiconductor layer. A gate region of each cell is disposed in the semiconductor layer adjacent its drain region.

Each cell further has a floating gate electrode that is insulatively disposed over a portion of the gate region. This floating gate electrode is electrically coupled to an erase region of the second conductivity type that is formed in the semiconductor layer remote from the gate region. A control electrode is insulatively disposed over at least that portion of the floating gate electrode that is over the gate region. A common source region of the second conductivity type is formed adjacent a plurality of the gate regions in the semiconductor layer, and is spaced from the drain regions and the erase regions. Preferably, an integral contact is formed to this common source region through a dielectric layer to couple the source region to a source voltage.

A further aspect of the invention comprises an array of EEPROM cells that are formed at a face of a semiconductor layer of a first conductivity type. The cells are formed in a plurality or rows and in a plurality of columns formed at an angle to the rows. The array comprises a plurality of common source regions of a second conductivity type opposite the first conductivity type. These source regions are formed at the intersection of every other even row and every even column. A plurality of common erase regions of the second conductivity type are formed at the face at the intersections of every even column and those rows not occupied by the source regions. A plurality of drain regions of the second conductivity type are formed at the face at the intersections of the odd columns and the odd rows, such that the drain regions, the source regions and the erase regions are disposed in a spaced-apart relationship.

A plurality of gate regions of the first conductivity type are disposed at the face to space each of the source regions from a plurality of drain regions. A floating gate electrode for each gate region is insulatively disposed over a portion thereof. Each floating gate electrode extends from its respective gate region to be electrically coupled to an erase region. The erase region is coupled to a plurality of floating gate electrodes. A plurality of control electrodes are insulatively disposed over at least those portions of the floating gate electrodes that are in turn disposed over portions of the gate regions. The control electrodes preferably take the form of elongate control lines that are disposed in a column direction over columns of the floating gate electrodes. In a particularly preferred embodiment, each control electrode curves around the erase, source and drain regions adjacent to it in a sinuous manner. The control electrodes are preferably used to partially self-align dopant implantations into the source, drain and erase regions.

A principal advantage of the invention is the combination of flash EEPROM cell operation with X-cell technology. Each erase region is preferably coupled to four floating gate electrodes and is in turn connected through a contact to an erase line that is further connected to other erase regions on the row. In a preferred embodiment, each common source region serves as the source for four select transistors that are disposed in spaced relationship about its perimeter. Thus, the preferred embodiment of the invention consists of a double "X"-cell topology, with one "X" compromising select transistors and another "X" compromising floating gate electrode couplings through tunnel windows to an erase region. The use of an X-cell topology in a EEPROM design may shrink the required array area by as much as 20%.

BRIEF DESCRIPTION OF THE DRAWINGS

Further aspects of the invention and their advantages will be comprehended with reference to the following Detailed Description in conjunction with the appended Drawings, in which:

FIG. 1b is a schematic sectional view taken substantially along line 1b—1b of FIG. 1a;

FIG. 2b is a schematic sectional view taken substantially along line 2b—2b of FIG. 2a;

FIG. 3b is a schematic sectional view taken substantially along line 3b—3b of FIG. 3a;

FIG. 4b is a schematic sectional view taken substantially along line 4b—4b of FIG. 4a.

DETAILED DESCRIPTION OF THE INVENTION

Figure 1A:
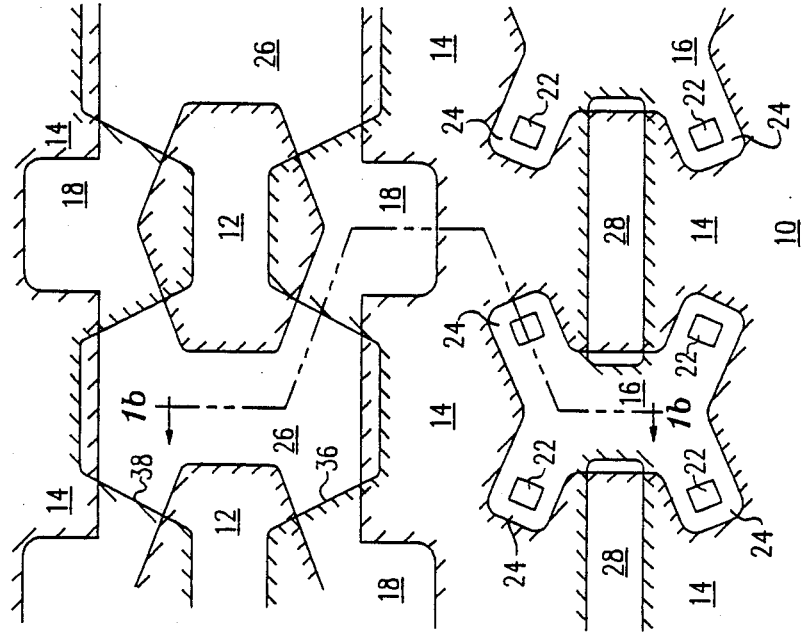
FIG. 1a is a highly enlarged schematic plan view of a portion of an EEPROM array according to the invention, showing beginning stages of fabrication.
Figure 1B:
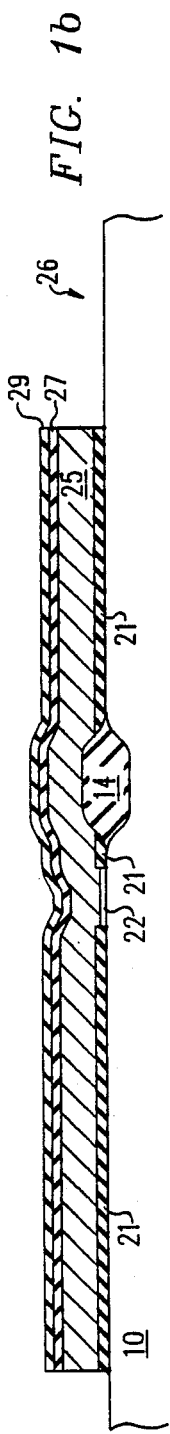

Referring first to FIGS. 1a and 1b, planar and sectional schematic views of a small portion of an EEPROM array according to the invention are shown, illustrating beginning steps in fabricating the array. In the illustrative embodiment, the array is fabricated on a p type semiconductor substrate or layer 10, which can, for example, be formed of silicon.

The moat areas are patterned in the conventional manner and a thick dielectric layer such as field oxide is grown on layer 10. In this manner a plurality of hexagonal field oxide islands 12 and integral field oxide regions 14 are defined to form a plurality of x-shaped orifices 16 therein, also formed in rows alternating with the rows in which islands 12 are situated. The upper boundary of integral field oxide layer 14 is U-shaped at regions 18. A source region will later be formed between oxide islands 12, drain regions will be formed within U-shaped regions 18, and erase regions will be formed within orifices 16, as will all be described in further detail below. A preferred field oxide thickness is about 8000 Angstroms.

Next, 350 Angstroms of a first gate oxide 21 (FIG. 1b) is grown over all exposed regions of semiconductor layer 10. A plurality of tunnel windows 22 are then patterned and etched through the gate oxide to semiconductor layer 10. Each tunnel window is located in a leg or protrusion 24 of orifices 16. In the illustrated embodiment, windows 22 are dimensioned to be approximately 1.0 micron wide by 1.0 micron long. The outer boundaries of each tunnel window 22 should be at least 0.5 microns removed from the field oxide boundary of orifice 16. A thin tunnel oxide layer is then grown inside tunnel windows 22. A preferred thickness of the window oxide layer is about 100 Angstroms.

After the tunnel oxide has been grown, a first conductive layer 25 (FIG. 1b) is deposited over the entirety of the substrate. As made out of polycrystalline silicon, this layer 25 is preferred to be approximately 3000 Angstroms thick. Then, an interlevel oxide/nitride combination is deposited on the polysilicon layer 25. Preferably, this first inter level dielectric layer comprises 250 Angstroms of oxide 27 (FIG. 1b) and approximately 250 Angstroms of nitride 29 ($Si_3N_4$; FIG. 1b). The combined thickness of this double dielectric layer 27 and 29 is approximately electrically equivalent to 400 Angstroms of oxide.

The nitride layer 29, oxide layer 27 and first poly layer 25 are then patterned and etched to the configuration best shown in FIG. 1a. Most of the surface remains covered with these layers 25, 27 and 29. However, the nitride 29, oxide 27 and poly 25 are etched away from areas 26, in which the source regions (described below) will be formed. Further, orifices 28 are also pattened and etched in the oxide/nitride/first poly layers 29, 27 and 25. Each orifice 28 spans in a horizontal or row direction from one orifice 16 to the next and function to separate adjacent floating gates. Polysilicon layer 25, nitride layer 29 and oxide layer 27 are etched to form an upper saw tooth boundary 36 that traverse between field oxide islands 12 and field oxide area 14. At the top of FIG. 1a, an oxide/nitride/first poly boundary 38 is formed to extend between field oxide islands 12 and field oxide area 14 and to define the upper limits of regions 26.

Figure 2A:
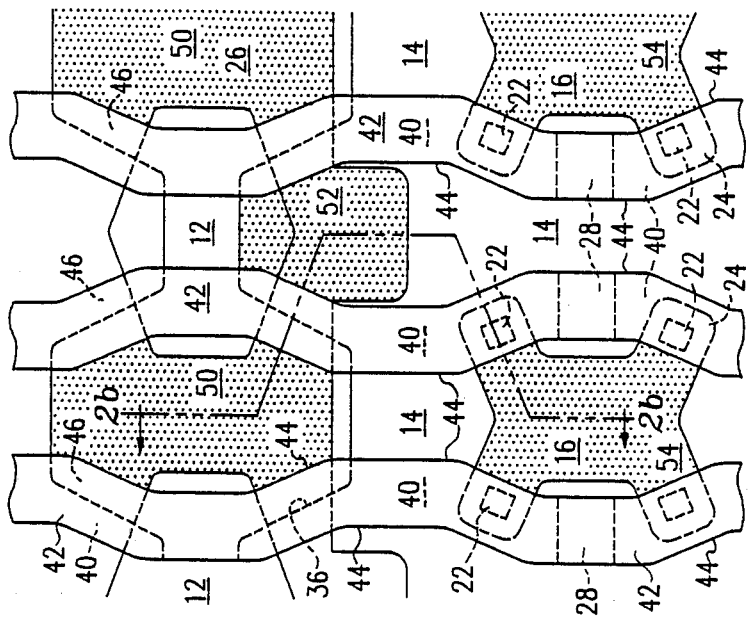
FIG. 2a is a plan view of the portion of the EEPROM array shown in FIG. 1a, showing intermediate stages of array fabrication.
Figure 2B:
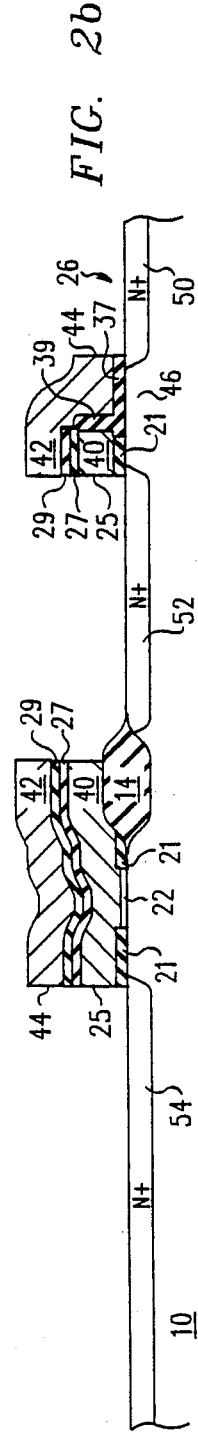

Referring now to FIGS. 2a and 2b, further steps in fabricating the EEPROM array of the invention are shown. After first poly layer 25 (FIG. 1b), nitride layer 29 and oxide layer 27 have been patterned and etched into the "first poly" pattern shown in FIG. 1a, a second gate oxide layer 37 (FIG. 2b) is grown on all exposed silicon surfaces. At the time that layer 37 is grown, sidewall oxide layers 39 are grown (one shown in FIG. 2b) to insulate first poly layer 25 (FIG. 1b) at this stage.

A second polysilicon layer is next deposited over the entire surface, as by chemical vapor deposition, to approximately 5000 Angstroms in thickness. Then a stack gate etch is performed that etches the second polysilicon layer, the interlevel nitride and oxide layers 27 and 29, and the first poly layer 25. The stack gate etch produces a plurality of floating gate electrodes 40 from first poly layer 25, and a plurality of control gate electrodes 42 from the second polylayer.

As best shown in FIG. 2a, each floating gate electrode 40, whose outline is shown in phantom, extends from a field oxide island 12 to over a tunnel window 22. The end of each floating gate electrode 40 opposite a respective island 12 is proximate orifice 16 and is defined by clear area 28 that had been etched away earlier, as shown in FIG. 1a. Areas 28 are in the illustrated embodiment about 1.5 microns wide. One longitudinal margin of each elongate floating gate electrode is defined by sawtooth boundary 36 (or 38), which was produced in the first poly pattern and etch step.

The remaining limits of each floating gate electrode 40 are aligned in a planar projection with the longitudinal boundaries 44 of a respective control gate electrode 42. The longitudinal boundaries 44 define a plurality of gate regions 46 of the select and memory transistors of each EEPROM cell. The transverse boundaries of each gate region 46 are defined by the boundary of a field oxide island 12 on one hand and field oxide sheet 14 on the other.

As shown, floating gate electrode 40 covers approximately one half of the area of gate region 46, while control gate electrode is superimposed over the remaining half. FIG. 2b shows on the right hand side, that the control gate electrode 42 is further superimposed on top of floating gate electrode 40. The width of floating gate electrode 40 over gate region 46 is in the illustrated embodiment about 1.5 microns, and the width of each control electrode shown is about 3.0 microns.

Each floating gate electrode 40 extends from over gate region 46 to a boundary 48 such that it will cover a respective window 22. As shown, four floating gate electrodes 40 extend over respective windows 22, which in turn are disposed within a single field oxide orifice 16.

In a preferred embodiment, a single control gate electrode 42 is provided for each column, and covers each floating gate electrode 40 in the column. In array terminology, each control gate electrode 42 constitutes a word line. Preferably, control electrodes or word lines 42 are not straight, but are formed in a sinuous pattern so as to avoid the centers of the future drain, source and erase regions described below.

Following the deposit of the second poly layer and the stack gate etch to define electrodes 40 and 42, a blanket n+source, drain and erase implant is performed. This implantation step forms a plurality of n+source regions 50, a plurality of n+drain regions 52 and a plurality of n+erase regions 54. Regions 50, 52 and 54 are entirely self-aligned by the combination of control electrodes 42 (and the stacked structures therebeneath) and field oxide areas 12 and 14. The implantation step creates a plurality of source regions 50 which are each adjacent four gate regions 46, which are in turn disposed in an "X" fashion around the periphery of source region 50. Each drain region 52 serves as a common drain for two horizontally opposed cell memory/select transitors. Each erase region 54 is adjacent four tunnel windows 22, and therefore can be electrically coupled to four floating gate electrodes 40. Four tunnel windows 22 are disposed radially around each gate region 54 in an "X" fashion. Each erase region 54 is formed to be remote from all source regions 50, gate regions 46 and drain regions 52.

Figure 3B:
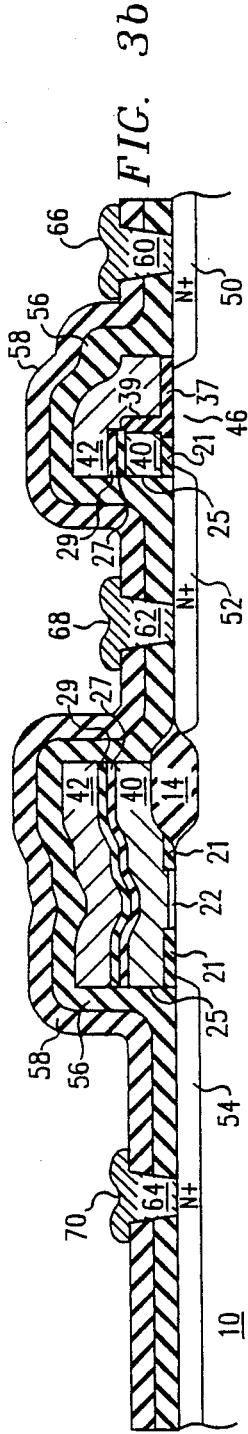
Figure 3A:
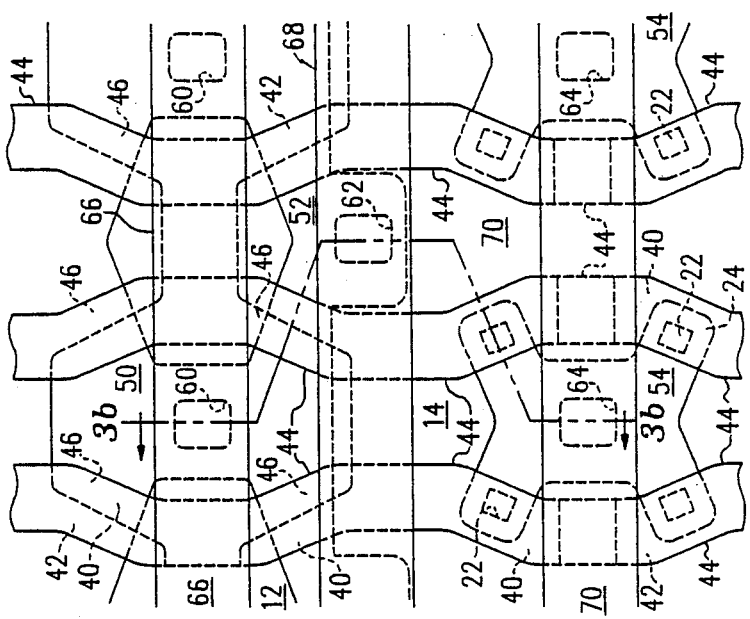
FIG. 3a is a plan view corresponding to FIGS. 1a and 2a, showing final stages in the fabrication of the array.

Referring next to FIGS. 3a and 3b, the final steps of fabricating an X-cell EEPROM array according to the invention are shown. A thick multilevel dielectric layer is deposited over the entire surface of the array. In the illustrated embodiment, the multilevel dielectric layers comprise an oxide layer 56 and a phosphosilicate glass layer 58. Layers 56 and 58 are shown in FIG. 3b, but are omitted for purposes of clarity in FIG. 3a. Layers 56 and 58 together will in most instances be several thousand Angstroms thick.

Next. a plurality of contact are patterned and etched through layers 56 and 58. These contacts include an integral source region contact 60 for each source region 50, an integral drain region contact 62 for each drain region 52, and an integral erase region contact 64 for each erase region 54. Then, a plurality of metal or other conductive source lines 66, drain lines 68 and erase lines 70 are disposed, patterned and etched to be elongate in a row direction and parallel to each other.

The distance from any contact 60, 62 or 64 to any electrode 40 or 42 is in the illustrated embodiment approximately 1.5 microns.

Typically voltage values for write, read and erase operations of the array of the invention are set out in the following table:

| Node | Writing | Reading | Erase |
|---|---|---|---|
| Source | 0.0 V | 0.0 V | floats |
| Drain | 12.5 V | 5.0 V | floats |
| Control Gate | 12.5 V | 5.0 V | 0.0 V |
| Erase Line | Floats | Floats | 15–20 V |

Referring particularly to FIG. 3a, the erase operation proceeds by impressing an erase voltage on a selected conductive erase line 70 selected from a range of 15 to 20 volts as shown by the arrow. This sets up a sufficient potential to draw electrons from a double row of charged floating gate electrodes 40, through tunnel windows 22, into the substrate and into a column erase regions 54, through contacts 64 and finally to erase line 70. The array of the present invention is capable of performing a flash erase of an entire double row of cells at a time, with the erasing of four floating gate electrodes proceeding from one erase line contact 64.

Figure 4B:
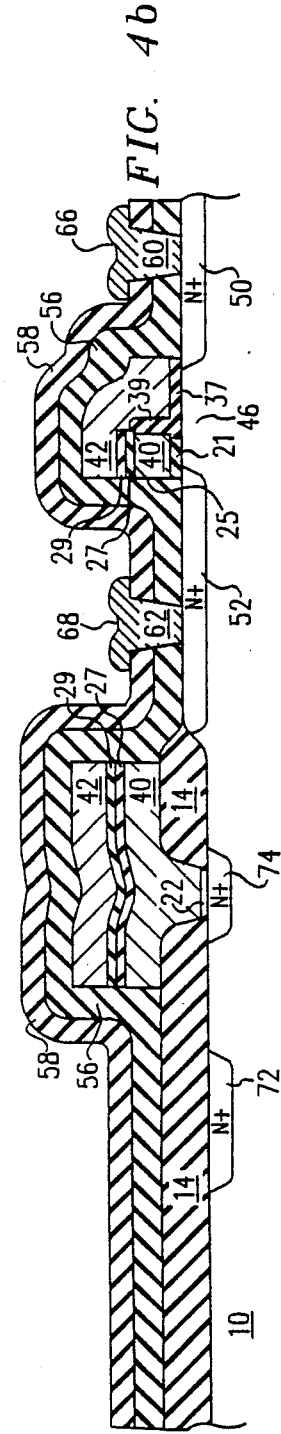
Figure 4A:
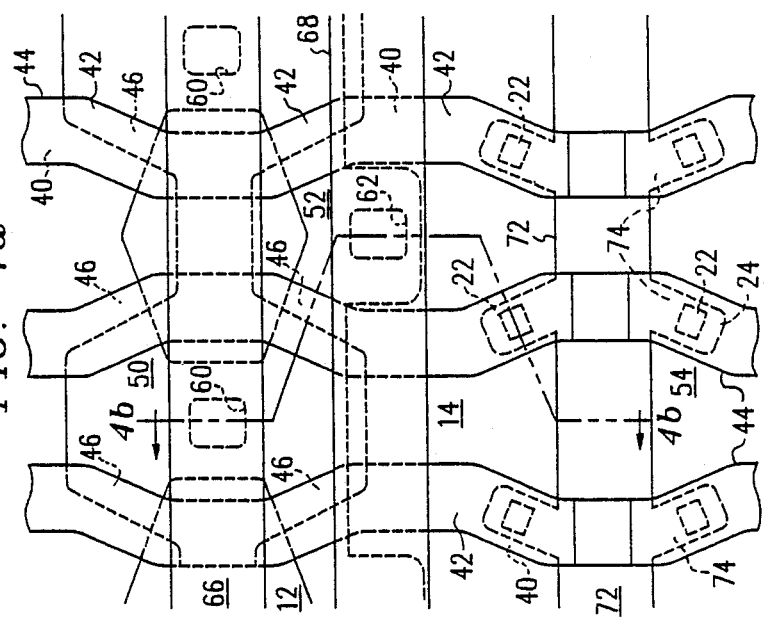
FIG. 4a is a highly enlarged schematic plan view of an alternative embodiment of the invention that uses an implanted erase line.

An alternative embodiment of the invention is shown in FIGS. 4a and 4b, which respectively generally correspond to FIGS. 3a and 3b. Like parts have been numbered with like numerals wherever possible. In this embodiment, an n+erase line 72 is first implanted into substrate 10 before the previously described steps are performed. Field oxide sheet 14 is then formed to extend over all of erase line 72. Erase line 72 has a plurality of protrusions or legs 74 which are defined to extend to areas of the substrate underneath respective windows 22 along the row. Each floating gate electrode 40 will therefore be directly coupled through a respective window 22 to a leg 74 of diffused erase line 72.

In summary, a novel X-cell layout has been described for a EEPROM array. The array combines the advantages of a flash-erasable EEPROM array with the relative compactness of an X-cell design.

While illustrated embodiments and their advantages have been described in the above detailed description, the invention is not limited thereto, but only by the spirit and scope of the appended claims.

What is claimed is:

1. A plurality of electrically programmable and erasable memory cells formed at a semiconductor surface and a substrate, comprising:

first, second, third and fourth drain regions of a first conductivity type at said surface;

a shared source region of said first conductivity type at said surface;

first and second erase regions of said first conductivity type at said surface, each of said erase regions separated from said drain regions by a portion of said surface of a second conductivity type;

a first floating gate, overlying a portion of said surface of said second conductivity type disposed between said first drain region and said shared source region, and overlying a portion of said first erase region;

a second floating gate, overlying a portion of said surface of said second conductivity type disclosed between said second drain region and said shared source region, and overlying a portion of said first erase region;

a third floating gate, overlying a portion of said surface of said second conductivity type disposed between said third drain region and said shared source region, and overlying a portion of said second erase region;

a fourth floating gate, overlying a portion of said surface of said second conductivity type disclosed between said fourth drain region and said shared source region, and overlying a portion of said second erase region;

a first word line overlying said first and third floating gates; and a second word line overlying said second and fourth floating gates.

2. The memory cells of claims 1, further comprising:
a first bit line conductor in contact with said shared source region;

a second bit line conductor in contact with said first and second drain regions;

a third bit line conductor in contact with said third and fourth drain regions;

a first erase line conductor in contact with said first erase region; and a second erase line conductor in contact with said second erase region.

3. The memory cells of claim 2, wherein said first, second and third bit line conductors, and said first and second erase line conductors, are substantially in parallel with one another.

4. The memory cells of claim 3, wherein said floating gates are at an angle relative to said bit line conductors at the locations overlying the portion of said surface between said shared source region and their associated drain region.

5. The memory cells of claim 1, wherein said floating gates are comprised of polycrystalline silicon.

6. The memory cells of claim 1, wherein said word lines are comprised of polycrystalline silicon.

7. The memory cells of claim 2, wherein said bit line conductors and said erase line conductors are comprised of a metal.

8. The memory cells of claim 1, wherein said floating gates are insulated from said erase regions by a dielectric layer.

9. The memory cells of claim 8, wherein said floating gates are insulated from said portions of said surface between said shared source region and their associated drain region by a dielectric layer;

said wherein said dielectric layer insulating said floating gates from said erase regions is thinner than the dielectric layer insulating said floating gates from said portions of said surface between said shared source region and their associated drain region.

10. A plurality of electrically programmable and erasable memory cells formed at a semiconductor surface of a substrate, comprising:

first, second, third and fourth drain regions of a first conductivity type at said surface;

first and second source regions of said first conductivity type at said surface;

a shared erase region of said first conductivity type at said surface, said shared erase region separated from said drain regions by a portion of said surface of a second conductivity type;

a first floating gate, overlying a portion of said surface of said second conductivity type disposed between said first drain region and said first source region, and overlying a portion of said shared erase region;

a second floating gate, overlying a portion of said surface of said second conductivity type disposed between said second drain region and said first source region; and overlying a portion of said shared erase region;

a third floating gate, overlying a portion of said surface of said second conductivity type disposed between said third drain region and said second source region, and overlying a portion of said shared erase region;

a fourth floating gate, overlying a portion of said surface of said conductivity type disposed between said fourth drain region and said second source region, and overlying a portion of said shared erase region;

a first word line overlying said first and third floating gates; and a second word line overlying said second and fourth floating gates.

11. The memory cells of claims 10, further comprising:

a first bit line conductor in contact with said first source region;

a second bit line conductor in contact with said second source region;

a third bit line conductor in contact with said first and second drain regions;

a fourth bit line conductor in contact with said third and fourth drain regions; and an erase line conductor in contact with said shared erase region.

12. The memory cells of claim 11, wherein said first, second, third and fourth bit line conductors, and said erase line conductor, are substantially in parallel with one another.

13. The memory cells of claim 12, wherein said floating gates are at an angle relative to said bit line conductors at the locations overlying the portion of said surface between their associated source and drain regions.

14. The memory cells of claim 10, wherein said floating gates are comprised of polycrystalline silicon.

15. The memory cells of claim 10, wherein said word lines are comprised of polycrystalline silicon.

16. The memory cells of claim 11, wherein said bit line conductors and said erase line conductor are comprised of a metal.

17. The memory cell of claim 10, wherein said floating gates are insulated from said shared erase region by a dielectric layer.

18. The memory cells of claim 17, wherein said floating gates are insulated from said portions of said surface between their associated source and drain regions by a dielectric layer;

and wherein said dielectric layer insulating said floating gates from said shared erase region is thinner than the dielectric layer insulating said floating gates from said portions of said surface between their associated source and drain regions.

* * * * *